(12) United States Patent
Katsura et al.

(10) Patent No.: US 7,002,253 B2
(45) Date of Patent: Feb. 21, 2006

(54) SEMICONDUCTOR DEVICE AND DESIGN METHOD THEREOF

(75) Inventors: Akihito Katsura, Katano (JP); Hiroo Yamamoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/832,245

(22) Filed: Apr. 27, 2004

(65) Prior Publication Data
US 2004/0217479 A1    Nov. 4, 2004

(30) Foreign Application Priority Data
Apr. 30, 2003   (JP) .............................. 2003-124726

(51) Int. Cl.
*H01L 23/52*         (2006.01)
(52) U.S. Cl. ..................... 257/758; 257/762; 257/766
(58) Field of Classification Search ................ 257/758, 257/762, 766
See application file for complete search history.

(56) References Cited

U.S. PATENT DOCUMENTS 5,933,364 A    8/1999   Aoyama et al.
6,066,896 A *  5/2000   Wada et al. ................ 257/758
6,166,440 A   12/2000   Yang
6,352,914 B1   3/2002   Ball et al.

FOREIGN PATENT DOCUMENTS

JP         11274424        10/1999

* cited by examiner

*Primary Examiner*—Douglas W Owens
(74) *Attorney, Agent, or Firm*—Stevens, Davis, Miller & Mosher, LLP

(57) ABSTRACT

It is an object of the present invention to achieve a semiconductor device capable of preventing circuit malfunctions caused by noise without decreasing an integration degree of the circuit by making a space between signal interconnections wider and inserting a shield or a shield layer between the signal interconnections. The semiconductor device has a multilayer interconnection structure wherein three or more interconnection layers are stacked on a silicon semiconductor substrate, and comprises: a first signal line which is formed with a (N−1)-th interconnection layer and comprises a latch circuit; a second signal line which is formed with a (N+1)-th interconnection layer and is arranged so as to cross the first signal line or partially overlap thereover; and a power supply interconnection serving as a shield interconnection which is formed with an N-th interconnection layer in a portion directly beneath the first signal line and the second signal line.

9 Claims, 13 Drawing Sheets

SEMICONDUCTOR DEVICE AND DESIGN METHOD THEREOF

BACKGROUND OF THE INVENTION

1. Field of the Invention

The present invention relates to a semiconductor device and its design method, and specifically to an interconnection layout capable of preventing circuit malfunctions caused by noise generated by, for example supply voltage fluctuation (power supply noise), and cross talk noise in semiconductor integrated circuits.

2. Prior Art

Noise caused by supply voltage fluctuation (hereinafter, referred to as "power supply noise") and cross talk noise in integrated circuits have been increasingly so significant as to be non-negligible as a degradation factor of a signal waveform with the progress of high-performance and high-density for LSI products in recent years. The main factor thereof may include such a reason that a signal level and a supply voltage must be reduced according to a MOS scaling rule while there can not be avoided an increase in noise generation in attempting to make CMOS circuits higher in speed. The increase in noise and the reduction in supply voltage make an SN ratio in a high-speed CMOS significantly degrade as far as the circuit is designed by means of employing the conventional technology and circuit design.

Herein, referring to a drawing shown in FIG. 12, description will be made of a conventional semiconductor device. FIG. 12 is a block diagram of the conventional semiconductor device, reference numeral 1 represents a plane virtually showing a (N−1)-th interconnection layer (N is an integer equal to two or more); reference numeral 2, a first signal line comprising a data latch function (latch circuit) formed with the (N−1)-th interconnection layer; and reference numeral 3, a second signal line formed with an N-th interconnection layer.

Hereinafter, referring to the semiconductor device configured as above, description will proceed to that operation. It is assumed at first that data at an L (low) level is retained on the first signal line 2 comprising the latch circuit. In the meanwhile, when a signal at an H (high) level is supplied to the second signal line 3, anode potential of the latch circuit directly beneath the second signal line 3 will become floating according to a coupling effect, so that data in the latch circuit may be inverted when the node potential exceeds VDD/2 (VDD is a power supply potential) which is a judgment level. A superior quality electric power supply has formerly been obtained only by arranging several decoupling capacitors on a substrate in a CMOS based design. However, ΔI noise (current noise) has been a major problem with making the CMOS higher in speed, and in order to reduce this noise, such measures have been taken in the conventional technology that, for example a space between signal interconnections has been made wider, a shield line has been arranged between these signal interconnections, or while a signal interconnection among internal interconnections has been made into a strip line structure in general, an earth (ground) layer or a power supply layer having wide area in so-called plate shaped pattern has been formed via an insulating layer on the upper and lower sides of an interconnection conductor formed as a signal interconnection. There is described a conventional technology in, for example JP-A 11-274424 (the term "JP-A" as used herein means an "unexamined published Japanese patent application") to prevent an adverse influence caused by the noise due to fluctuation in power supply voltage and the cross talk noise. According to this conventional technology, a ground line with a shield layer is provided on a memory cell, so that the noise generated by the voltage fluctuation on a power supply line is passed through the ground line through the shield layer, and thereby an incorrect inversion of data stored in the memory cell can be prevented.

However, in such an interconnection structure that reduces the noise by making the space between the signal interconnections wider and inserting the shield line or the shield layer between the signal interconnections as described above, an integration degree of the circuit has been inevitably decreased to thereby have a problem in achieving high density interconnection.

SUMMARY OF THE INVENTION

It is an object of the present invention to provide a semiconductor device and its design method capable of suppressing a decrease in an integration degree of a circuit and preventing circuit malfunctions caused by noise.

In a first semiconductor device according to the present invention, wherein three or more interconnection layers including a (N−1)-th (N is an integer equal to two or more) interconnection layer, an N-th interconnection layer, and a (N+1)-th interconnection layer are stacked on a substrate from a lower layer to an upper layer in order, and insulating layers are provided between the substrate and the lowest interconnection layer, and between respective interconnection layers, respectively, the semiconductor device comprises: a first signal line which is formed with the (N−1)-th interconnection layer and comprises a data latch function section; a second signal line which is formed with the (N+1)-th interconnection layer and is arranged so as to cross the first signal line or partially overlap thereover; and a power supply interconnection which is formed with the N-th interconnection layer and is arranged between the first signal line and the second signal line to function as a shield interconnection.

According to the configuration of the first semiconductor device described above, noise caused by voltage fluctuation of the second signal line can be shielded by the power supply interconnection to thereby prevent malfunctions of the data latch function section, and since it is not necessary to provide a new shield interconnection other than the power supply interconnection, additional new process steps for independently providing a shield interconnection are not required, and an integration degree of the circuit is not decreased, either.

In a first design method of the semiconductor device according to the present invention., wherein a plurality of interconnection layers including a (N−1)-th (N is an integer equal to two or more), and an N-th interconnection layer are stacked on a substrate from a lower layer to an upper layer in order, and insulating layers are provided between the substrate and the lowest interconnection layer, and between respective interconnection layers, respectively, the design method of the semiconductor device comprises: laying out a power supply interconnection formed with the N-th interconnection layer; recognizing the laid-out power supply interconnection as a shield interconnection; arranging a plurality of functional blocks comprising the semiconductor device; and among these, arranging a functional block which comprises a signal line formed with the (N−1)-th interconnection layer and is easy to be influenced by noise in a portion directly beneath the power supply interconnection recognized as the shield interconnection.

A second design method of the semiconductor device according to the present invention is characterized in that a plurality of laid-out power supply interconnections are provided and only a power supply interconnection provided with specified information among the plurality of power supply interconnections are recognized as a shield interconnection in the first design method of the semiconductor device.

According to the first and second design methods of the semiconductor device described above, the power supply interconnection is laid out first, and the functional block (for example, a latch circuit section which retains data at a low voltage in a standby state in a power supply control technology) which is easy to be influenced by the noise is then arranged directly beneath the power supply interconnection recognized as the shield interconnection, so that it is not necessary to newly provide a shield interconnection, and thereby malfunctions of the functional block caused by the power supply noise or the cross talk noise can be prevented without adding new process steps, and without decreasing an integration degree of the circuit, either.

In a second semiconductor device according to the present invention, wherein a plurality of interconnection layers including a (N−1)-th (N is an integer equal to two or more) interconnection layer, and an N-th interconnection layer are stacked on a substrate from a lower layer to an upper layer in order, and insulating layers are provided between the substrate and the lowest interconnection layer, and between respective interconnection layers, respectively, the semiconductor device comprises: collectively arranging a plurality of functional blocks which are formed with the (N−1)-th interconnection layer and are easy to be influenced by the noise in one portion on the substrate among three or more functional blocks comprising the semiconductor device; and arranging a shield layer formed with the N-th interconnection layer so as to cover directly over the plurality of functional blocks.

In a third design method of the semiconductor device according to the present invention, wherein a plurality of interconnection layers including a (N−1)-th (N is an integer equal to two or more) interconnection layer, and an N-th interconnection layer are stacked on a substrate from a lower layer to an upper layer in order, and insulating layers are provided between the substrate and the lowest interconnection layer, and between respective interconnection layers, respectively, the design method of the semiconductor device comprises: when three or more functional blocks comprising the semiconductor device are arranged, collectively arranging a plurality of functional blocks which are formed with the (N−1)-th interconnection layer and are easy to be influenced by the noise in one portion on the substrate among the three or more functional blocks; and arranging a shield layer formed with the N-th interconnection layer so as to cover directly over the plurality of functional blocks.

According to the configuration of the second semiconductor device, and the third design method of the semiconductor device described above, the shield layer which has formerly been distributedly arranged in a chip is collectively arranged in one portion, so that it is possible to reduce complication of the interconnections, and prevent a decrease in an integration degree of the circuit, and thereby malfunctions of the functional block caused by the power supply noise or the cross talk noise can also be prevented.

In a third semiconductor device according to the present invention, wherein a plurality of interconnection layers are stacked on a substrate, and insulating layers are provided between the substrate and the lowest interconnection layer, and between respective interconnection layers, respectively, the semiconductor device comprises: comprising a predetermined embedded circuit by a plurality of logic cells; and adding the shield layer formed with an upper interconnection layer among the plurality of interconnection layers to a whole area of the top of the logic cell comprising a functional block which is easy to be influenced by noise among the predetermined circuits.

In a fourth design method of the semiconductor device according to the present invention, wherein a plurality of interconnection layers are stacked on a substrate, a predetermined circuit embedded in the semiconductor device which comprises insulating layers between a substrate and the lowest interconnection layer, and between respective interconnection layers, respectively, is comprised of a plurality of logic cells, the design method of the semiconductor device comprises: preparing a plurality of logic cells with a shield layer in which the shield layer formed with an upper interconnection layer among the plurality of interconnection layers is added to the whole portion of the top of the cell in advance; and comprising a functional block which is easy to-be influenced by noise among the predetermined circuits by the logic cell with a shield layer.

According to the configuration of the third semiconductor device, and the fourth design method of the semiconductor device described above, the functional block which is easy to be influenced by the noise is designed by employing the logic cell with a shield layer, so that malfunctions caused by the power supply noise or the cross talk noise can be prevented, and in addition to that, since the shield layer is formed at the whole portion of the top of the functional block which is easy to be influenced by the noise, complication of the interconnections like a case of newly providing a shield interconnection is reducible, and a decrease in an integration degree of the circuit can be prevented.

In a fourth semiconductor device according to the present invention, wherein a plurality of interconnection layers including a (N−1)-th (N is an integer equal to two or more) interconnection layer, and an N-th interconnection layer are stacked on a substrate from a lower layer to an upper layer in order, and insulating layers are provided between the substrate and the lowest interconnection layer, and between respective interconnection layers, respectively, the semiconductor device comprises: a first signal line which is formed with the (N−1)-th interconnection layer and comprises a data latch function section; a second signal line which is formed with the N-th interconnection layer and is arranged so as to cross the first signal line or partially overlap thereover; and a level shifter which lowers a signal voltage of the second signal line directly over at least the first signal line to a data storage voltage of the data latch function section.

According to the configuration of the fourth semiconductor device described above, the signal voltage of the second signal line is lowered to the data storage voltage of the data latch function section by the level shifter, so that a voltage change in the data latch function section which is generated by a signal voltage change of the second signal line can be suppressed within a change below a voltage judgment level to thereby prevent malfunctions, and an integration degree of the circuit can not be decreased since it is not necessary to provide the shield layer or the like.

In a fifth semiconductor device according to the present invention, wherein a plurality of semiconductor elements are formed on a substrate, and a plurality of functional blocks, in which the semiconductor is connected to each other with a multilayer interconnection, are provided, the semiconductor device comprises: comprising a part of functional blocks among the plurality of functional blocks by a logic cell having a shield layer over the whole portion of the top of the cell; and comprising others of the functional blocks by a logic cell without a shield layer.

In a sixth semiconductor device according to the present invention, the shield layer which covers the top of the functional block comprised of the logic cell with a shield layer in the fifth semiconductor device also serves as a function of the power supply interconnection.

In a seventh semiconductor device according to the present invention, a fixed voltage is applied to the shield layer which also serves as the function of the power supply interconnection in the sixth semiconductor device.

In an eighth semiconductor device according to the present invention, the functional block comprised of the logic cell with a shield layer in the fifth semiconductor device is dynamically controlled.

In a ninth semiconductor device according to the present invention, a power supply potential of the functional block comprised of the logic cell with a shield layer in the fifth semiconductor device is controlled.

In a tenth semiconductor device according to the present invention, a substrate potential of the functional block comprised of the logic cell with a shield layer in the fifth semiconductor device is controlled.

In a fifth design method of the semiconductor device according to the present invention, when designing a semiconductor device in which a plurality of semiconductor elements are formed on a substrate, a plurality of functional blocks, in which the semiconductor is connected to each other with a multilayer interconnection, are provided, a part of the functional blocks among the plurality of functional blocks is comprised of a logic cell having a shield layer over the whole portion of the top the cell, and others of the functional blocks are comprised of the logic cell without a shield layer, the design method of the fifth semiconductor device comprises the steps of: designing the functional block employing the logic cell with a shield layer based on specified information for judging whether the shield layer is required for the functional block or not; and designing the functional block employing the logic cell without a shield layer based on the specified information.

In a sixth design method of the semiconductor device according to the present invention, the specified information includes position information which indicates a layout location of the power supply interconnection provided with a fixed potential among the plurality of power supply interconnections, and at least either information of power supply information which indicates a potential being set at each of the plurality of power supply interconnections, or dynamic control information which indicates the power supply interconnection arranged on the functional block which is controlled dynamically among the plurality of power supply interconnections in the design method of the fifth semiconductor device.

According to the configuration of above fifth to tenth semiconductor devices, and the fifth and sixth design method of the semiconductor devices, the functional block which is easy to be influenced by noise is designed by employing the logic cell with a shield layer, so that malfunctions caused by the power supply noise or the cross talk noise can be prevented, and in addition to that, since the shield layer is formed over the whole portion of the functional block which is easy to be influenced by the noise, complication of the interconnections like a case of newly providing the shield interconnection is reducible, and a decrease in an integration degree of the circuit can be prevented.

In an eleventh semiconductor device according to the present invention, wherein four or more interconnection layers including a (N−1)-th (N is an integer equal to two or more) interconnection layer, an N-th interconnection layer, a (N+1)-th interconnection layer, and a (N+2) interconnection layer are stacked on a substrate from a lower layer to an upper layer in order, and insulating layers are provided between the substrate and the lowest interconnection layer, and between respective interconnection layers, respectively, the semiconductor device comprises: a first signal line which is formed with the (N−1)-th interconnection layer and comprises a data latch function section; a node which is formed with the N-th interconnection layer and is connected to the first signal line via a through hole in the insulating layer to thereby comprise the data latch function section with the first signal line; a second signal line which is formed with the (N+2)-th interconnection layer and is arranged so as to cross the node or partially overlap thereover; and a power supply interconnection which is formed with the (N+1)-th interconnection layer and is arranged between the node and the second signal line to function as a shield interconnection.

According to the configuration of the eleventh semiconductor device described above, noise caused by voltage fluctuation of the second signal line can be shielded by the power supply interconnection to thereby prevent malfunctions of the data latch function section, and since it is not necessary to provide a new shield interconnection other than the power supply interconnection, additional new process steps for independently providing a shield interconnection are not required, and an integration degree of the circuit is not decreased, either.

In the semiconductor device and its design method according to the present invention described above, the substrate may be a silicon semiconductor substrate or may be a SOI (silicon on insulator) substrate.

As described above, according to the present invention, neither making the space between interconnections wider nor newly forming the shield layer is required like the conventional semiconductor device, and malfunctions caused by the noise in the integrated circuit can be prevented without further decreasing an integration degree of the circuit.

DETAILED DESCRIPTION OF THE PREFERRED EMBODIMENTS

Figure 1:
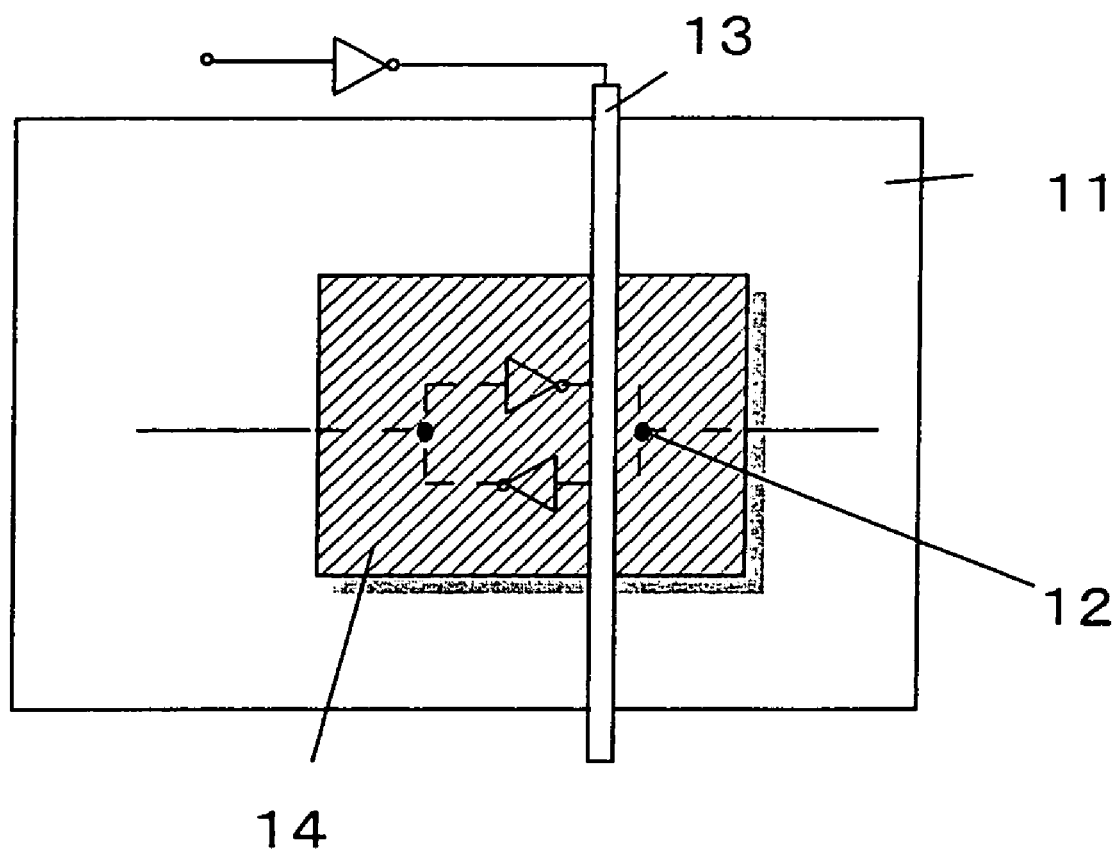
FIG. 1 is a block diagram of a semiconductor device in a first embodiment according to the present invention.

Referring to the drawings, description will be made of embodiments according to the present invention. Incidentally, interconnection layers formed on a substrate shall be given numbers which are incremented from a lower layer to an upper layer, like a first layer, a second layer, and so on in the following discussion. For example, an interconnection layer upper than a (N−1)-th interconnection layer by one represents an N-th interconnection layer in the following discussion.

(First Embodiment)

Referring to FIG. 1, description will be made of a configuration of a semiconductor device in a first embodiment according to the present invention. In FIG. 1, reference numeral 11 represents a plane virtually showing a (N−1)-th interconnection layer (N is an integer equal to two or more); reference numeral 12, a first signal line which is formed with the (N−1)-th interconnection layer and comprises a data latch function (latch circuit); reference numeral 13, a second signal line formed with a (N+1)-th interconnection layer; and reference numeral 14, a power supply interconnection which is formed with an N-th interconnection layer and provided with a shield interconnection.

The semiconductor device of this embodiment is comprised of a multilayer interconnection structure wherein three or more interconnection layers are stacked on a silicon semiconductor substrate, and insulating layers are provided between the silicon semiconductor substrate and the lowest interconnection layer, and between respective interconnection layers, respectively, and comprises: the first signal line 12 which is formed with the (N−1)-th interconnection layer and comprises the latch circuit; the second signal line 13 which is formed with the (N+1)-th interconnection layer and is arranged so as to cross the first signal line 12 or partially overlap thereover; and the power supply interconnection 14 which is formed with the N-th interconnection layer between the first signal line 12 and the second signal line 13. Herein, the first signal line 12 formed with the (N−1)-th interconnection layer which comprises the latch circuit is arranged in a portion directly beneath the second signal line 13 or a vicinity of that portion, and the power supply interconnection 14 formed with the N-th interconnection layer is arranged so as to cover the first signal line 12, is provided with a fixed potential that does not change, and functions as a shield interconnection. The potential provided to this power supply interconnection 14 may be a fixed potential that does not change, and may be provided with VSS (ground potential) or VDD (power supply potential).

Hereinafter, description will be made of an operation of the semiconductor device configured as above. It is assumed at first that the first signal line 12 comprising the latch circuit retains data at an L level. In the meanwhile, a node potential of the latch circuit directly beneath the second signal line 13 will become floating according to a coupling effect when a signal at an H (high) level is supplied to the second signal line 13, so that data in the latch circuit may be inverted if the node potential exceeds a judgment level VDD/2. However, the power supply interconnection 14, which is formed with the N-th interconnection layer, is arranged as a shield interconnection, and is provided with the fixed potential like this embodiment, eliminates the coupling effect, and prevents the data inversion in the latch circuit, so that malfunctions can be prevented.

According to this embodiment, the power supply interconnection 14 formed with the N-th interconnection layer is arranged as a shield interconnection between the first signal line 12 formed with the (N−1)-th interconnection layer and comprising the latch circuit, and the second signal line 13 formed with the (N+1)-th interconnection layer as mentioned above, so that the power supply interconnection 14 can shield noise (cross talk noise) generated by voltage fluctuation of the second signal line 13, and since a shield interconnection other than the power supply interconnection 14 is not required by means of utilizing the power supply interconnection 14 which also serves as the shield interconnection, an addition of new process steps is not required, and thereby an integration degree of the circuit is not decreased.

Incidentally, in order to utilize the power supply interconnection 14 which also serves as a shield interconnection in this embodiment, although the power supply interconnection 14 arranged so as to cover the first signal line 12 is formed in a plate shape, it may be formed in a lattice shape, or a stripe shape.

(Second Embodiment)

Figure 2:
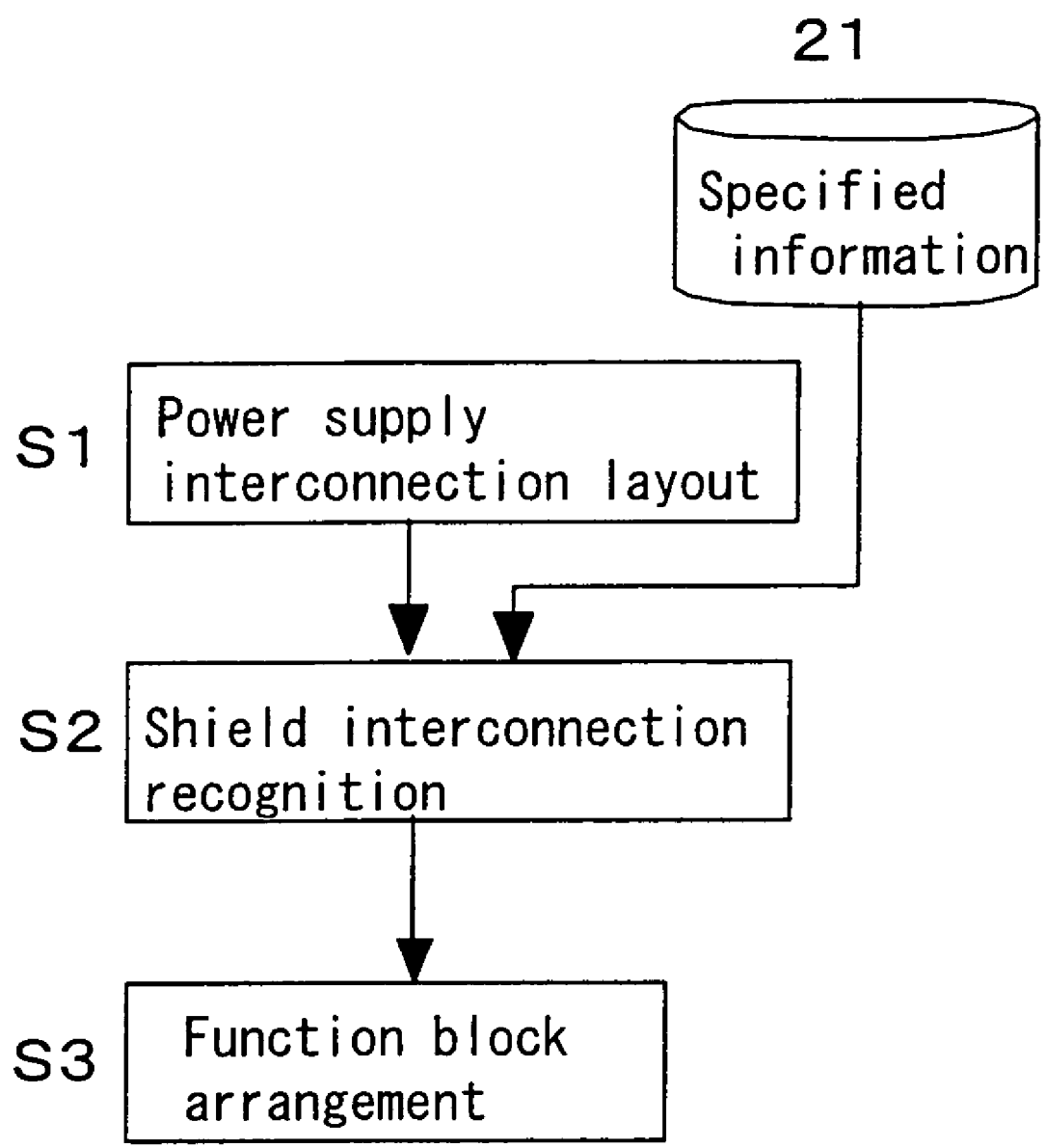
FIG. 2 is a flow chart showing a design method of a semiconductor device in a second embodiment according to the present invention.

FIG. 2 is a flowchart of a layout method of a semiconductor device of a second embodiment according to the present invention. Referring to FIG. 2, description will be made of the layout method hereafter.

Figure 13:
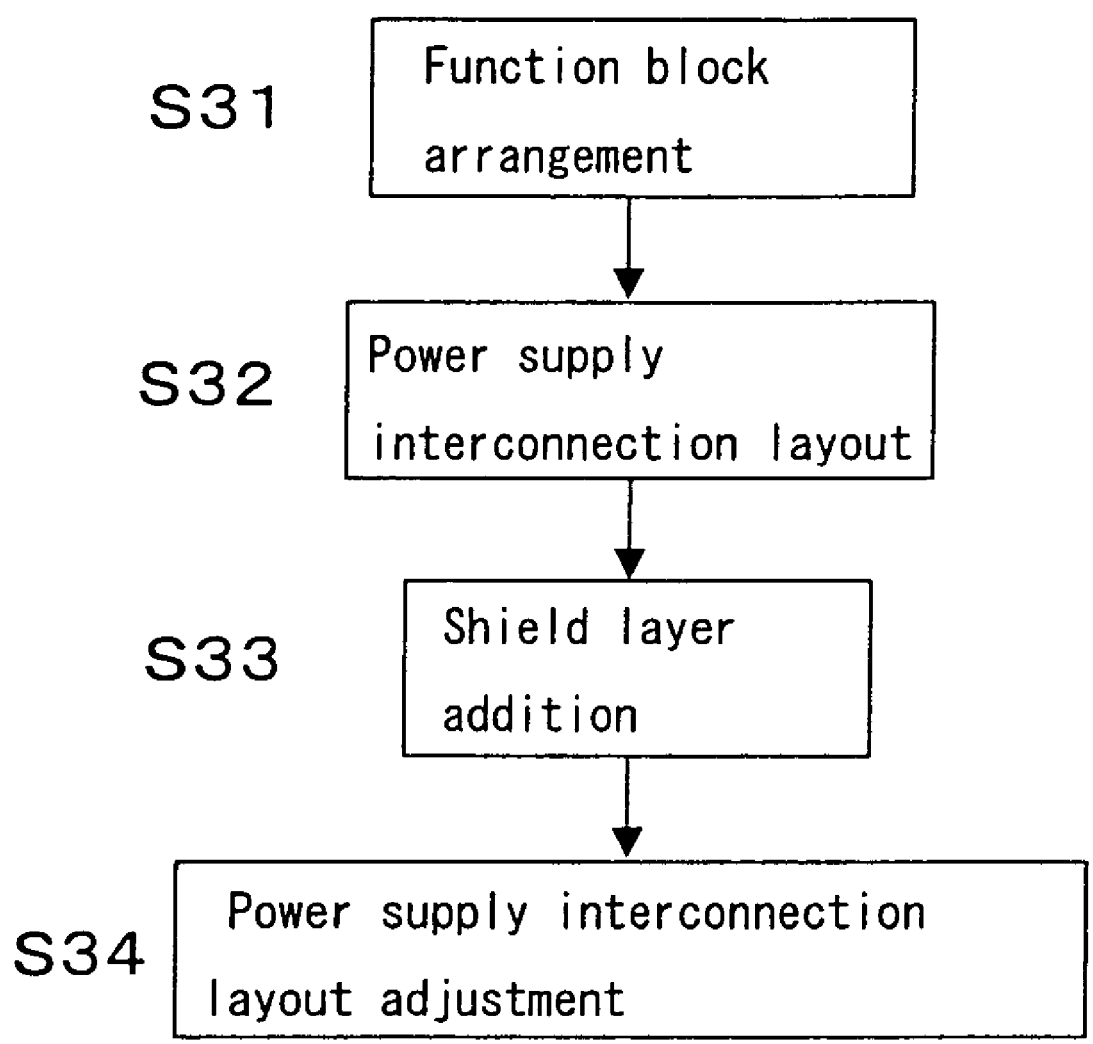
FIG. 13 is a flow chart showing a design method of the conventional semiconductor device.

In the former layout method for the integrated circuit, the power supply interconnection is generally laid out after arranging the functional block as shown in FIG. 13. Further, there is employed a layout method that a functional block, for example a precharge type circuit, a precharge type bus and domino logic or the like, which is easy to be influenced by power supply noise or cross talk noise, is provided with a shield layer, and a signal line that can be a source of the noise is routed in the upper layer. However, according to the layout method of this embodiment, the power supply interconnection is previously laid out (step S1), and the power supply interconnection is recognized as the shield interconnection (step S2), and a plurality of functional blocks configuring an integrated circuit are subsequently arranged. In this case, the functional block which is easy to be influenced by the power supply noise or the cross talk noise is arranged under the power supply interconnection recognized as the shield interconnection (step S3). Further, specified information 21 is given to a power supply interconnection used as the shield interconnection among the plurality of power supply interconnections, so that only the power supply interconnection to which the specified information 21 has been given is recognized as the shield interconnection, and the functional block which is easy to be influenced by the noise may be arranged thereunder.

Incidentally, when the power supply interconnection is formed with the N-th interconnection layer, the functional block which is easy to be influenced by the noise comprises at least an interconnection portion formed with the (N−1)-th interconnection layer.

When this layout method is applied to a layout of the semiconductor device of the first embodiment, the power supply interconnection 14 formed with the N-th interconnection layer is laid out, the power supply interconnection 14 is then recognized as the shield interconnection, and subsequently the latch circuit comprising a portion (signal line 12 or the like) formed with the (N−1)-th interconnection layer is arranged directly beneath a portion of the power supply interconnection 14. In this case, the noise (cross talk noise) caused by voltage fluctuation of the second signal line 13 arranged in a layer upper than the power supply interconnection 14 can be prevented.

According to this embodiment, the functional block which is easy to be influenced by the noise is arranged beneath the power supply interconnection recognized as the shield interconnection as mentioned above, so that a new shield layer other than the power supply interconnection is not required, and thereby the power supply noise and the cross talk noise can be prevented and malfunctions of the functional block can be prevented without adding new process steps and also without decreasing an integration degree of the circuit, either. Herein, description will proceed to the power supply noise. The noise (power supply noise) is generated due to an overshoot and an undershoot of a steep change of the power supply line at rising and falling points thereof when the supplied voltage is controlled, for example, within a part of the blocks in designing a multi-power supply. Such power supply noise as described above can be prevented according to this embodiment.

(Third Embodiment)

Figure 3:
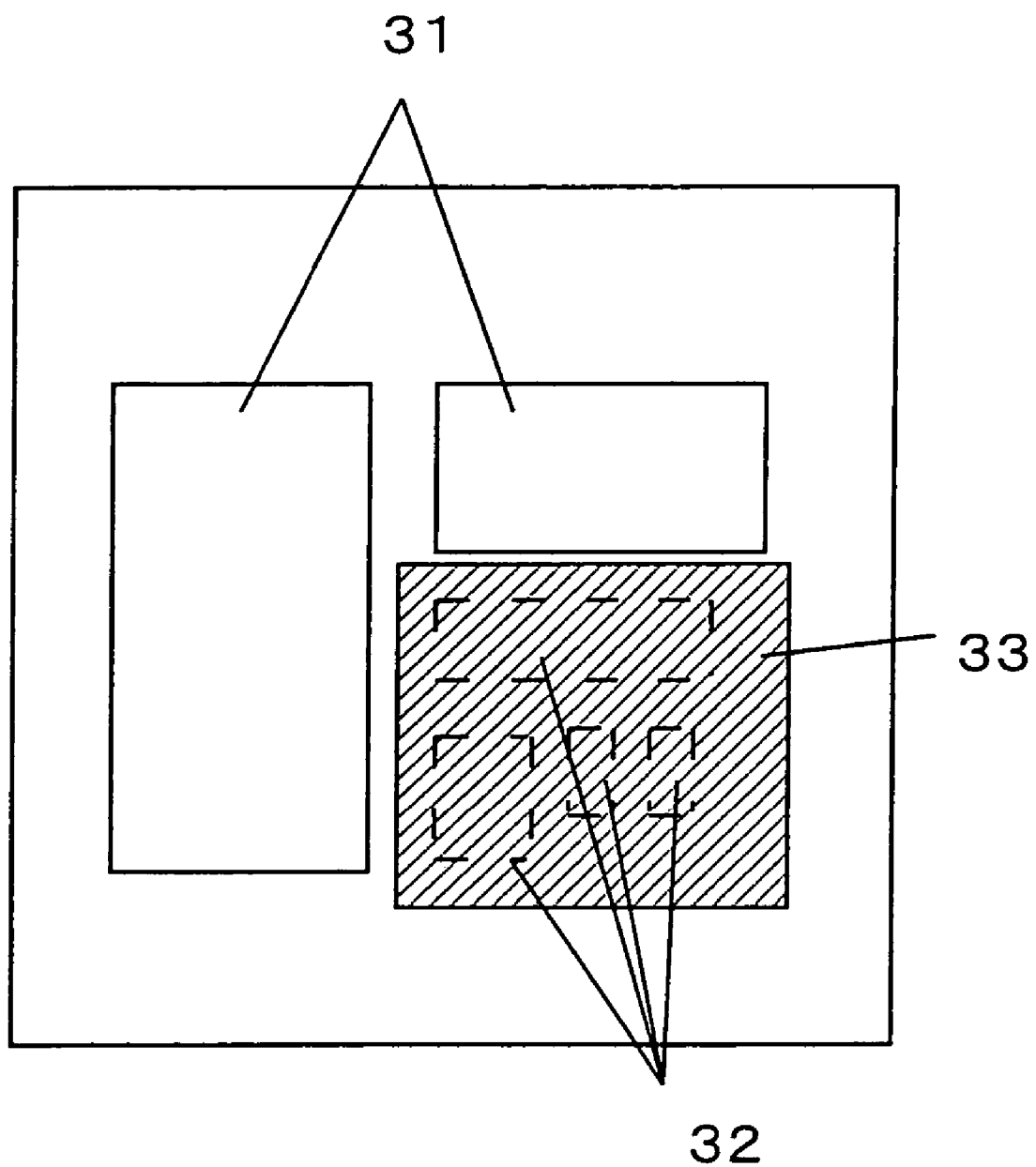
FIG. 3 is a layout pattern of a semiconductor device in a third embodiment according to the present invention.

Referring to FIG. 3, description will be made of a block diagram showing a layout method of a semiconductor device of a third embodiment according to the present invention. In FIG. 3, reference numeral 31 represents a functional block which is hard to be influenced by power supply noise; reference numeral 32, a functional block which is easy to be influenced by the power supply noise; and reference numeral 33, a shield layer.

In the layout method of this embodiment, when arranging a functional block on a chip, a plurality of functional blocks 32 (for example precharge circuit and domino logic circuit) which are easy to be influenced by the noise are collectively arranged in one portion, and the shield layer 33 is arranged in the upper layer in a plate shape pattern. In the semiconductor device designed and produced in this way, the shield layer 33 is provided with a fixed potential of VSS or VDD, so that malfunctions caused by the power supply noise of the functional block 32 can be prevented. Herein, it is assumed that the power supply interconnection for control (not shown) which generates the power supply noise is arranged in a layer upper than the shield layer 33 when the power supply potential (VDD) control or the substrate potential (VSS) control is carried out in the functional block 32.

Incidentally, when the shield layer 33 is formed with the N-th interconnection layer, a plurality of functional blocks 32 which are easy to be influenced by the noise have an interconnection portion formed with at least the (N−1)-th interconnection layer.

According to this embodiment, the shield layer which has formerly been distributedly arranged in a chip is collectively arranged in one portion as mentioned above, so that complication of the interconnections is reducible. It will therefore be understood that a decrease in an integration degree of the circuit can be prevented by means of reducing complication of the interconnections.

(Fourth Embodiment)

Figure 4A:
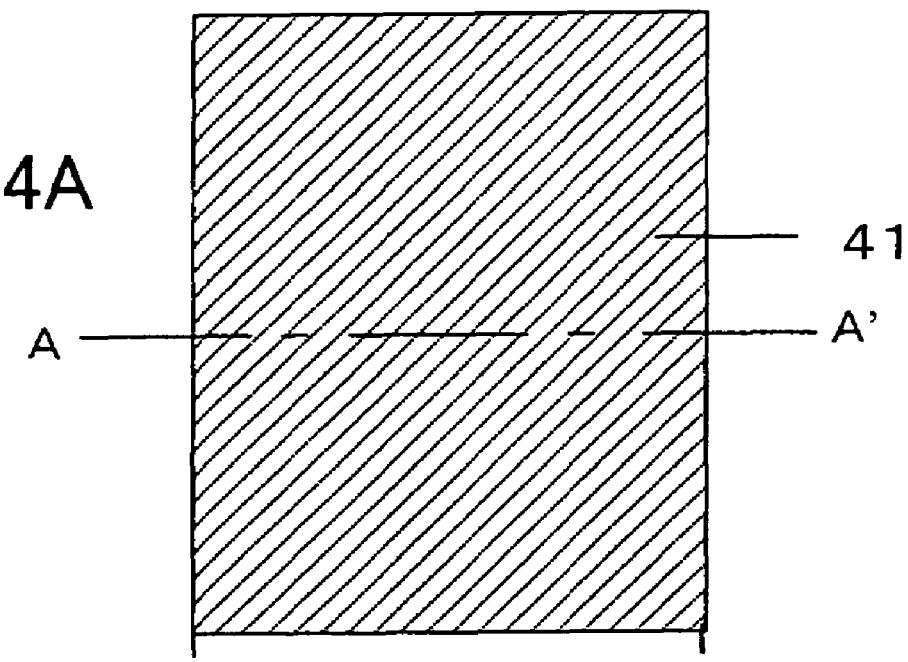
FIG. 4A is a plane view of a cell of a logic cell library of a semiconductor device in a forth embodiment according to the present invention.
Figure 4B:
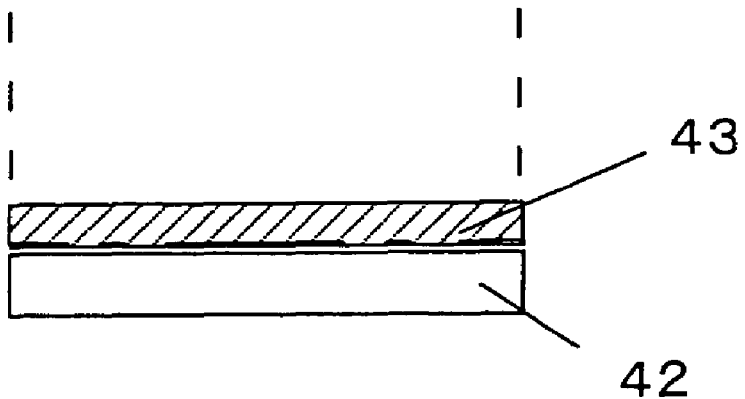
FIG. 4B is a sectional view of the cell in FIG. 4A.

Referring to FIG. 4A, description will be made of a plan view showing a cell configuration of a logic cell library of a semiconductor device in a forth embodiment according to the present invention. FIG. 4B is a sectional view along A–A' in FIG. 4A. In FIG. 4A and FIG. 4B, reference numeral 41 represents a logic cell employed in this embodiment; reference numeral 42, a normal logic cell portion; and reference numeral 43, a shield layer.

In this embodiment, a functional block which is hard to be influenced by power supply noise is designed using a normal logic cell which comprises the normal logic cell portion 42, and a functional block which is easy to be influenced by the power supply noise is designed using the logic cell 41 which is provided with the shield layer 43 in a layer upper than the normal logic cell portion 42 in advance.

For example, when this embodiment is applied to the configuration in FIG. 3, the functional block 31 which is hard to be influenced by the noise can be designed using the normal logic cell, and the functional block 32 which is easy to be influenced by the noise and the shield layer 33-arranged thereover can be designed using the logic cell 41 provided with the shield layer 43.

According to this embodiment, the cell library comprising the plurality of the logic cells 41 with a shield layer is prepared in addition to the normal logic cell, and the functional block which is easy to be influenced by the power supply noise is designed using the logic cell 41 with a shield layer as mentioned above, so that process steps for newly providing a shield interconnection can be eliminated. The semiconductor device designed and manufactured in this way can prevent circuit malfunctions caused by the noise, and in addition to that, since the shield layer is formed in the whole portion of the top of the functional block which is easy to be influenced by the noise, complication of the interconnections is reducible, and a decrease in an integration degree of the circuit can be prevented like a case where the normal logic cell is arranged and the new shield interconnection is then provided thereover.

(Fifth Embodiment)

Figure 5:
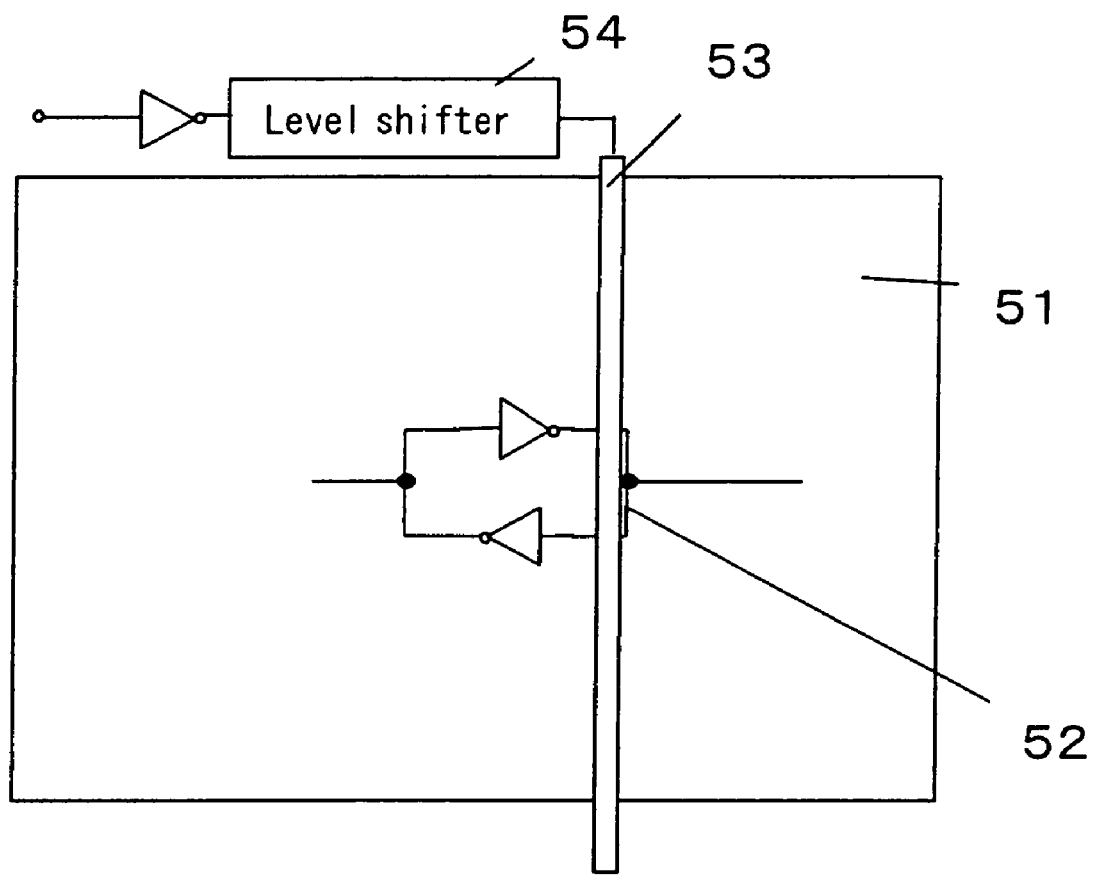
FIG. 5 is a block diagram of a semiconductor device in a fifth embodiment according to the present invention.

Referring to FIG. 5, description will be made of a block diagram of a semiconductor device in a fifth embodiment according to the present invention. In FIG. 5, reference numeral 51 represents a plane virtually showing a (N−1)-th interconnection layer (N is an integer equal to two or more); reference numeral 52, a first signal line which is formed with a (N−1)-th interconnection layer and comprises a data latch function (latch circuit); reference numeral 53, a second signal line formed with the N-th interconnection layer; and reference numeral 54, a level shifter.

The semiconductor device of this embodiment, wherein a plurality of interconnection layers are stacked on a silicon semiconductor substrate and insulating layers are provided between the silicon semiconductor substrate and the lowest interconnection layer, and between respective interconnection layers, respectively, comprises: the first signal line 52 which is formed with the (N−1)-th interconnection layer and comprises the latch circuit; the second signal line 53 which is formed with the N-th interconnection layer and is arranged so as to cross the first signal line 52 or partially overlap thereover; and the level shifter 54 which lowers a signal voltage of the second signal line 53 at least directly over the first signal line 52 to a data storage voltage of the latch circuit.

Hereinafter, referring to the semiconductor device configured as above, description will proceed to an operation thereof. It is assumed at first that data at an L level is retained on the first signal line 52 which comprises the latch circuit. In the meanwhile, a node potential of the latch circuit directly beneath the second signal line 53 will become floating according to a coupling effect when a signal at an H (high) level is supplied to the second signal line 53, so that the data in the latch circuit may be inverted if the node potential exceeds a judgment level VDD/2. However, the voltage of the signal line 53 directly over the latch circuit is lowered to the data storage voltage of the latch circuit by the level shifter 54 like this embodiment, so that a voltage change in the latch circuit which is caused by a signal voltage change of the signal line 53 can be suppressed within a change below the voltage judgment level to thereby prevent malfunctions.

According to this embodiment, malfunctions of the latch circuit can be prevented by providing the level shifter 54 as mentioned above, and since it is not necessary to provide a shield layer or the like, an integration degree of the circuit can not be decreased.

(Sixth Embodiment)

Figure 6:
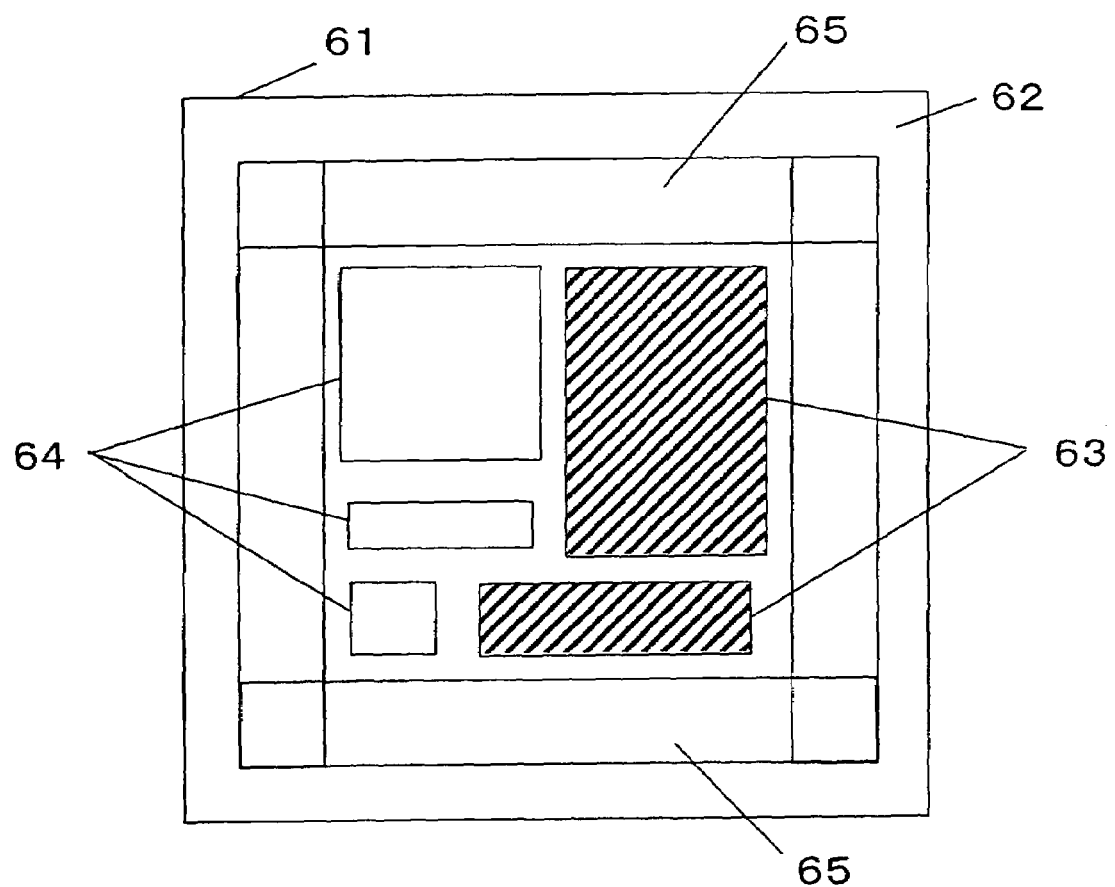
FIG. 6 is a plane view showing a configuration of a semiconductor device in a sixth embodiment according to the present invention.
Figure 7:
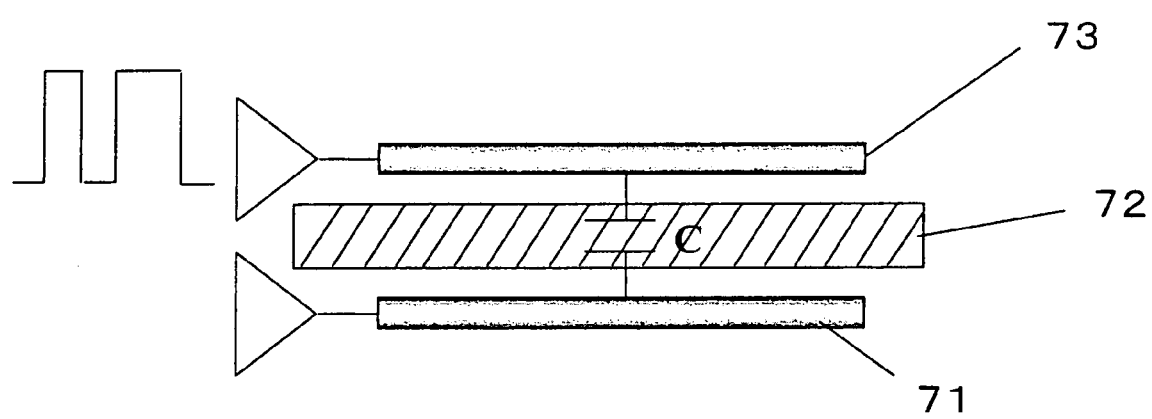
FIG. 7 is a view showing an example of a cross sectional configuration of a macro cell of a semiconductor device in the sixth embodiment according to the present invention.

Referring to FIG. 6, description will be made of a plan view showing a configuration of a semiconductor device in a sixth embodiment according to the present invention. FIG. 7 is a view showing an example of a cross sectional configuration of a macro cell (=logic cell) of this semiconductor device.

The semiconductor devices 61 of this embodiment is a semiconductor chip, such as system LSIs, and comprises: a functional block 64 which is arranged in a core area on a substrate (semiconductor substrate) 62 and comprises a plurality of macro cells that include INV, NAND, RAM, DRAM or the like and have a specific function; a functional block 63 which comprises a plurality of macro cells that are provided with a shield layer for reducing a noise effect on the top thereof in advance (macro cell with a shield layer), include INV, NAND, RAM or the like, and have a specific function; and an input/output circuit arranged in an interface area 65 on the substrate (I/O area) as shown in FIG. 6.

Each macro cell with a shield layer comprising the functional block 63 has a structure that as opposed to the macro cell which has a multilayer interconnection structure comprising, for example three interconnection layers and has not a shield layer, a shield layer 72 is formed with the fourth interconnection layer over that uppermost third interconnection layer so as to cover the top of the whole cell via an interlayer insulating film as shown in FIG. 7. Although these multilayer interconnection layers are generally used as signal interconnections, the shield layer 72 is neither connected to a power supply interconnection nor a ground interconnection (power supply interconnection to which a ground potential VSS is provided) in the macro cell, but provided with a fixed potential (for example VSS) form an external source. Further, if the fixed voltage which does not change is provided, the power supply interconnection and the ground interconnection can be used as the shield layer.

In this embodiment, the functional block 64 comprising a plurality of macro cells without a shield layer, and the functional block 63 comprising a plurality of macro cells with a shield layer are mixedly arranged on the semiconductor chip as shown in FIG. 6. Moreover, there exists a portion where a signal line 71 arranged within the macro cell, and a signal line 73 arranged outside the macro cell and formed with an upper interconnection layer are closely arranged in parallel in the section of a predetermined length as shown in FIG. 7. The shield layer 72 exists between the signal line 71 and the signal line 73 even in the portion where the signal line 71 within the macro cell and the signal line 73 outside the macro cell are closely arranged like this, so that even when the noise is generated by the signal change of the signal line 73, the transmission of this noise is interrupted by the shield layer 72, and thereby the noise does not exert an adverse influence to the signal line 71 within the macro cell.

Next, description will proceed to an operation of the semiconductor device of this embodiment. The shield layer which covers the top of the functional block comprising the macro cell with a shield layer is provided with a fixed potential (for example VSS) from an external source, and are neither connected to the power supply interconnection nor the ground interconnection in the macro cell as mentioned above. Thereby, the shield layer is kept at the same potential.

It will therefore be understood that even in the portion where the signal line 71 within the predetermined macro cell and the signal line 73 outside this macro cell are closely arranged as shown in FIG. 7, the transmission of the noise which exerts an adverse influence thereto is interrupted the by shield layer 72 existing between both signal lines. Description will be made taking an example of a latch node in a macro cell with a latch function in the functional block for controlling the power supply as a remarkable example. First, the signal line 71 is a part of interconnections of the latch node, and the macro cell latches information supplied from an external source at a normal power supply potential VDDA. Herein, it is assumed that supplied information is at an L level. Next, in a state where the operation of the functional block is halted, in order to lower the power consumption in the functional block, the power supply potential of the macro cell is lowered to a certain fixed potential VDDB (VDDB<VDDA) to retain the data while the macro cell keeps a state of latching the data at an L level. It is assumed that the normal power supply potential VDDA is then transmitted to the signal line 73 from another functional block to which the power supply is not controlled. The transmitted VDDA then changes the potential of the signal line 71 to be pulled up via an interconnection capacitance between the signal line 71 and the signal line 73 being closely arranged, so that the data at an L level of the signal line 71, which is retained by lowering the power supply potential of the macro cell to the certain fixed potential VDDB, may be rewritten into data at an H level. The transmission of the noise exerting an adverse influence is therefore interrupted by the shield layer 72 existing between both signal lines 71 and 73 as shown in FIG. 7, so that rewriting of unintended data can be prevented, and thereby malfunctions can be prevented.

Thus, in addition to preventing circuit malfunctions caused by the noise, since the shield layer is formed over the whole portion of the top of the functional block 63 comprising the macro cell with a shield layer, complication of the interconnections like a case where after arranging the normal macro cell without a shield layer, the shield interconnection is newly provided thereover is reducible, so that a decrease in an integration degree of the circuit can be prevented.

(Seventh Embodiment)

Figure 8:
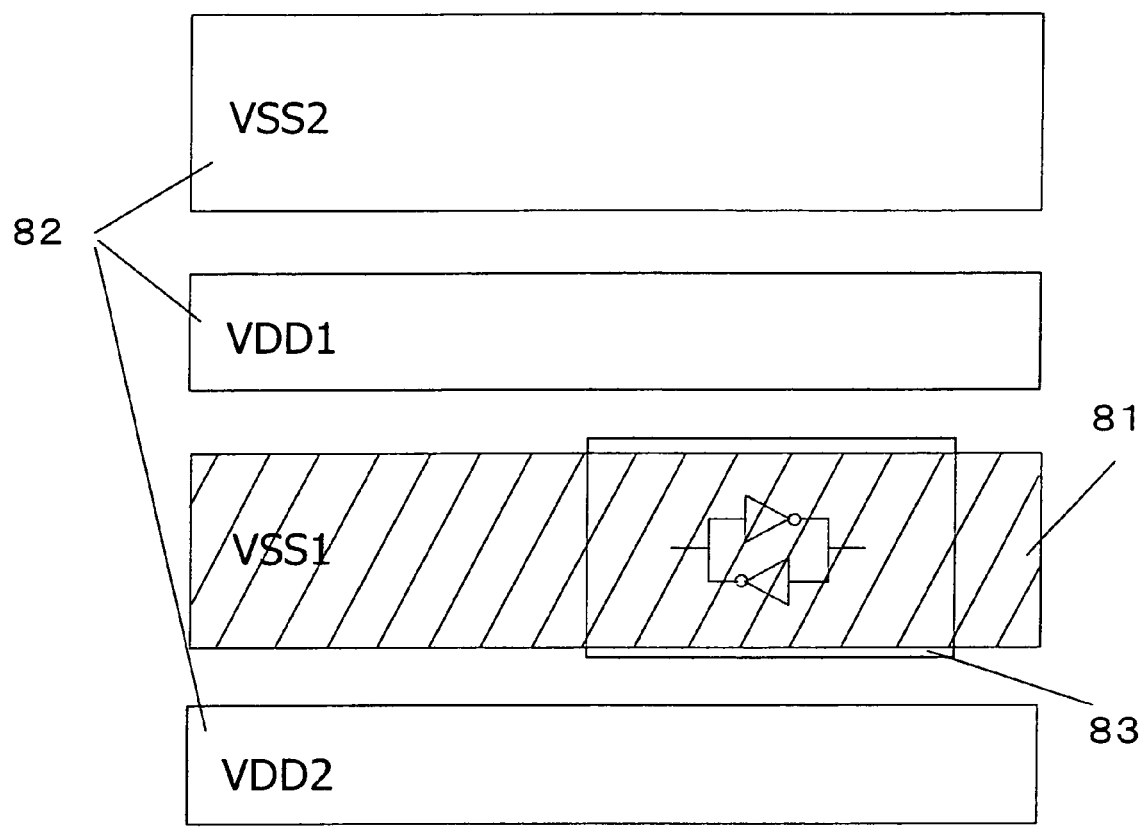
FIG. 8 is a plane view showing a configuration of a semiconductor device in a seventh embodiment according to the present invention.
Figure 9:
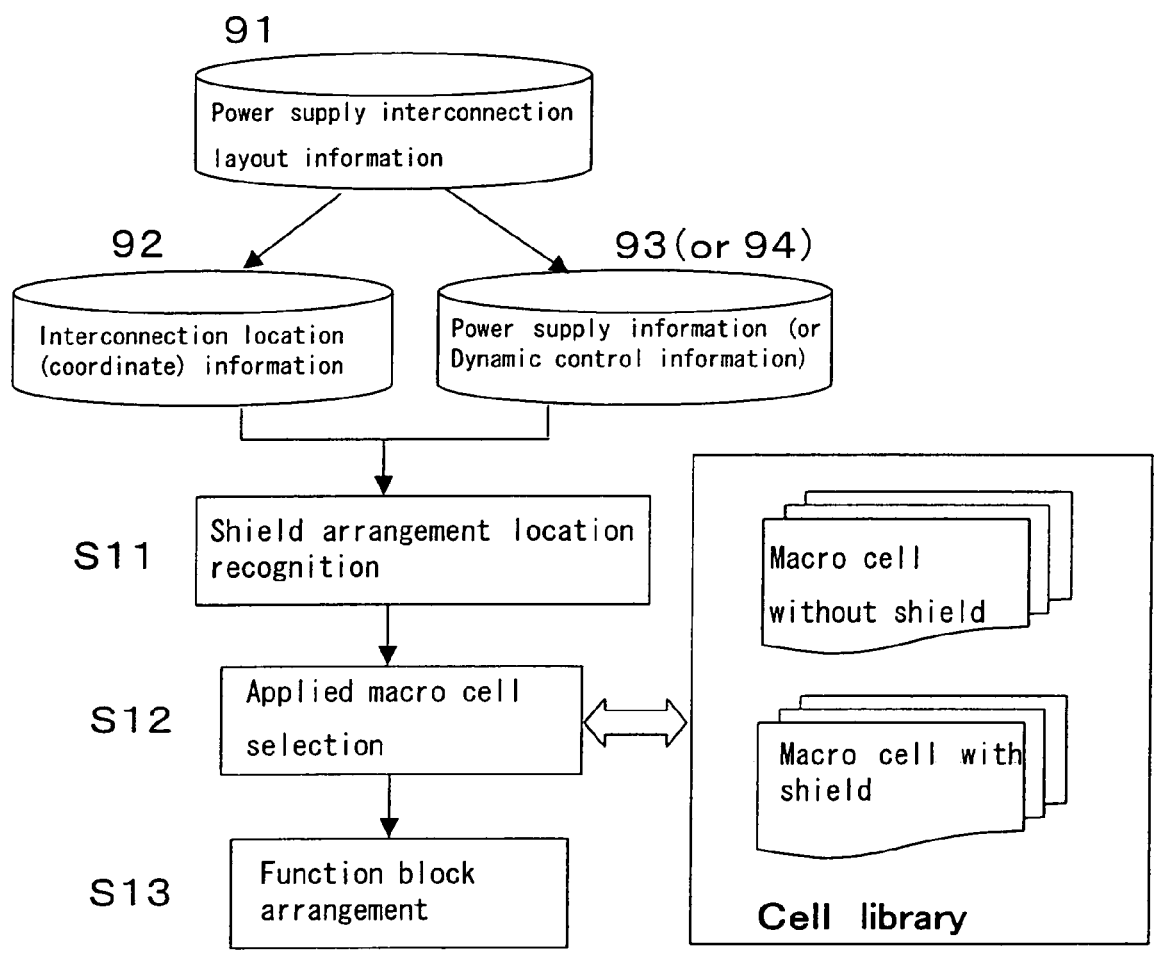
FIG. 9 is a flow chart showing a design method of a semiconductor device in the seventh embodiment according to the present invention.

Referring to FIG. 8 and FIG. 9, description will be made of a plan view showing a configuration of a semiconductor device in a seventh embodiment according to the present invention and a flow chart showing a design method of the semiconductor device in this seventh embodiment, respectively.

In FIG. 8, reference numeral 81 represents a power supply interconnection which is used for a shield layer and provided with a fixed potential (for example VSS); reference numeral 82, a power supply interconnection which is not used for the shield layer; and reference numeral 83, a functional block which is easy to be influenced by noise. A remarkable discrepancy between a configuration of this embodiment and that of the sixth embodiment mentioned above is to use the power supply interconnection 81 as a shield layer as shown in FIG. 8. That is, the functional block 83 which is easy to be influenced by the noise is comprised of the macro cell with a shield layer shown in FIG. 7, and this shield layer 72 of the macro cell also serves as the power supply interconnection 81, and since the configuration other than this is approximately the same as that of the sixth embodiment mentioned above, the description thereof will be omitted.

According to a design method in this embodiment, a cell library comprising a plurality of macro cells with a shield layer is prepared in addition to a plurality of normal macro cell (macro cell without a shield layer), and a plurality of power supply interconnections formed as upper interconnections in advance are laid out first. Information on this power supply interconnection laid out includes power supply interconnection layout information 91, and it is the information on spacing, line width, location or the like of the power supply interconnections arranged in, for example a lattice shape and a stripe shape. Interconnection location information 92 is location (coordinate: planar location and layer) information on a power supply interconnection provided with a fixed potential among the plurality of power supply interconnections. Power supply information 93 is information on potentials set at each of the plurality of power supply interconnections, for example information indicating that a certain power supply interconnection is always set at the same potential VDDA, or that there is a case when the certain power supply interconnection may be set at the potential VDDA or the potential VDDB (VDDB<VDDA) (information indicating a type of multi-power supply setup). The interconnection location information 92 and the power supply information 93 are such information as a designer extracts from the power supply interconnection layout information 91 and gives individual parameters thereto in advance.

At step S11, an automated design tool recognizes as the shield interconnection a power supply interconnection which is provided with only a fixed potential from an external source and whose potential does not change based on the interconnection location information 92 and the power supply information 93, and also recognizes the planar location and the layer (formative layer) of the interconnection.

At step S12, a macro cell (macro layer with a shield layer) which has a shield layer in a layer of above power supply interconnection and is required for forming the functional block is selected from a cell library. At step S13, the macro cell selected at step S12 is automatically arranged to comprise the functional block. Incidentally, when the functional block does not require the shield, the macro cell without a shield layer is selected to comprise the functional block at steps S12 and S13.

For example, the functional block which is easy to be influenced by the noise (functional block, the power supply to which is controlled in particular), can be comprised of the macro cell with a shield layer, and the functional block which is hard to be influenced by the noise can be comprised of the macro cell without a shield layer as mentioned above. Further, a macro cell with a function of being hard to be influenced by the noise among the functional blocks which are easy to be influenced by the noise may be partially comprised by selecting the macro cell without a shield layer.

According to this embodiment, an almost similar effect to the sixth embodiment mentioned above can be obtained, and in addition to that, an additional shield layer is not required by means of utilizing the power supply interconnection as the shield layer, so that process steps for providing a new shield layer may not be added thereto, and thereby an integration degree of the circuit is not decreased, either. Further, a process step for adjusting the location of the power supply interconnection can be eliminated after arranging the cells and adding the shield layer as shown in FIG. 13 (S34).

(Eighth Embodiment)

Figure 10:
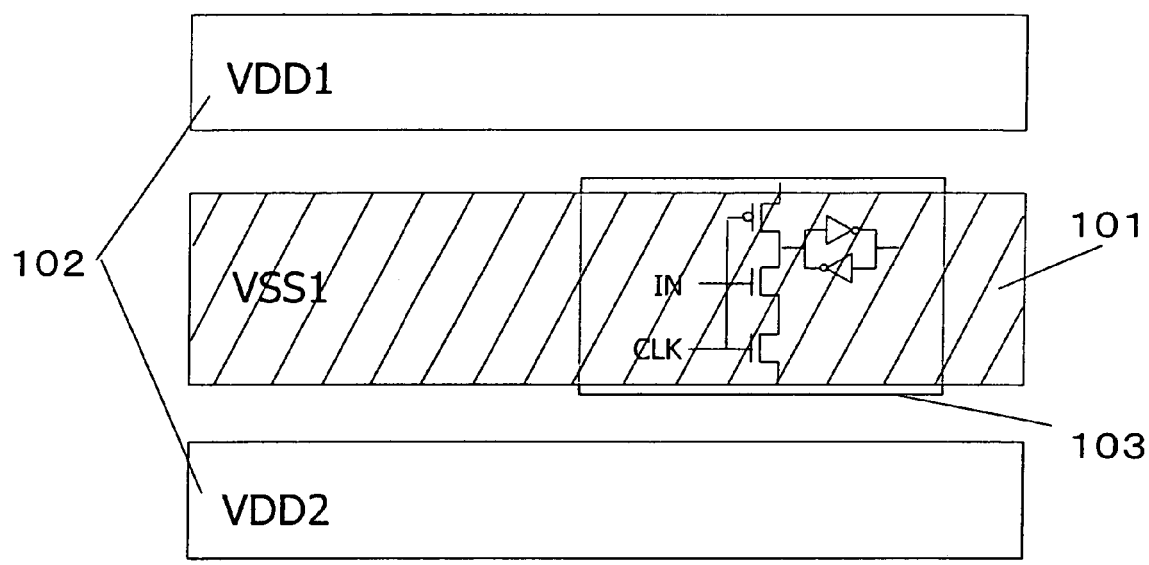
FIG. 10 is a plane view showing a configuration of a semiconductor device in an eighth embodiment according to the present invention.

Referring to FIG. 10, description will be made of a plan view showing a configuration of a semiconductor device in an eighth embodiment according to the present invention. In FIG. 10, reference numeral 101 represents a power supply interconnection which is used for a shield layer and provided with a fixed potential (for example VSS); reference numeral 102, a power supply interconnection which is not used for a shield layer; and reference numeral 103, a functional block which is controlled dynamically.

A remarkable discrepancy between this embodiment and the seventh embodiment mentioned above is that a functional block covered a the shield layer is the functional block 103 which is controlled dynamically as shown in FIG. 10. Further, dynamic control information 94 substituting with the power supply information 93 is given thereto as specified information (Refer to FIG. 9). Since the configuration other than this is approximately the same as that of the seventh embodiment mentioned above, the description thereof will be omitted. Hereinafter, description will proceed to the different points.

It is known in general that a functional block which is controlled dynamically will tend to be influenced by noise caused by a change of CLK (clock). As measures against it, the functional block which is controlled dynamically comprises the macro cell with a shield layer in this embodiment similar to the functional block, the power supply to which is controlled. Herein, the functional block which is controlled dynamically 103 is arranged under the power supply interconnection 101 provided with a fixed potential of a certain specific location. Therefore, prior to step 11, a designer produces the dynamic control information 94 as information indicating that the functional block arranged under the power supply interconnection of the certain specific location obtained from the power supply interconnection layout information 91 is controlled dynamically. In this case, at step S11, the automated design tool recognizes as the shield interconnection the power supply interconnection arranged on the functional block which is controlled dynamically and is provided with a fixed potential that does not-change based on the interconnection location information 92 and the dynamic control information 94, and also recognizes the interconnection location and the layer (formative layer).

According to this embodiment, malfunctions due to recognizing a glitch on the power supply line as a glitch on the CLK signal while the CLK signal line should not change at all in the dynamic circuit can be prevented. Further, flexibility in laying out the CLK signal line can be improved.

(Ninth Embodiment)

Figure 11A:
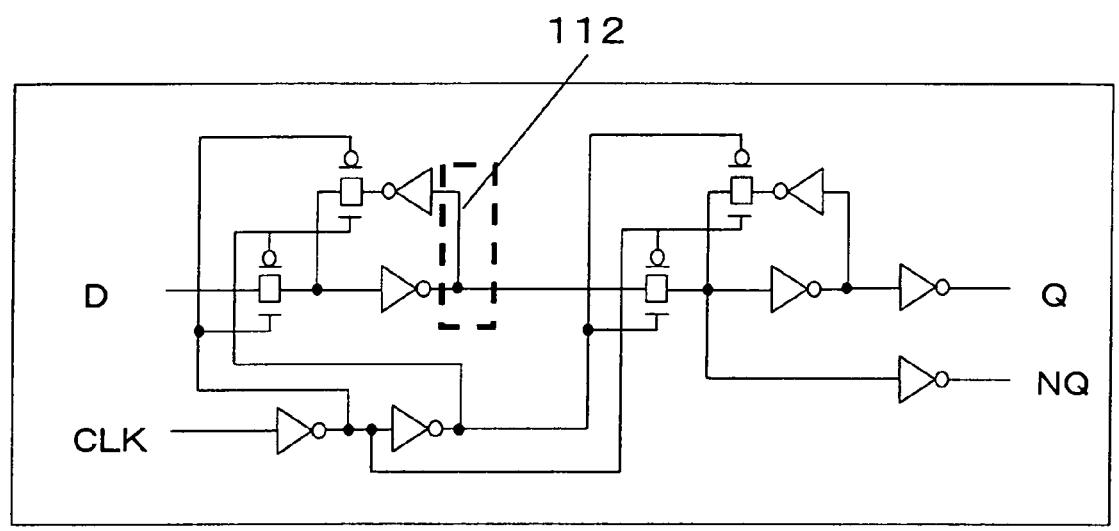
FIG. 11A is a circuit diagram of a latch circuit embedded in a semiconductor device in a ninth embodiment according to the present invention.
Figure 11B:
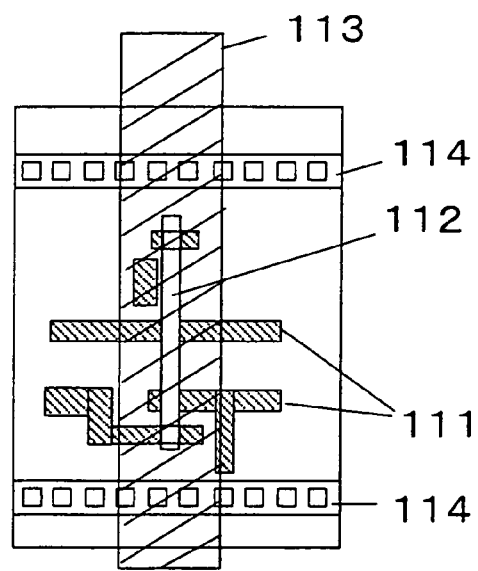
FIG. 11B is a plane view showing an interconnection example of the latch circuit in FIG. 11A.
Figure 12:
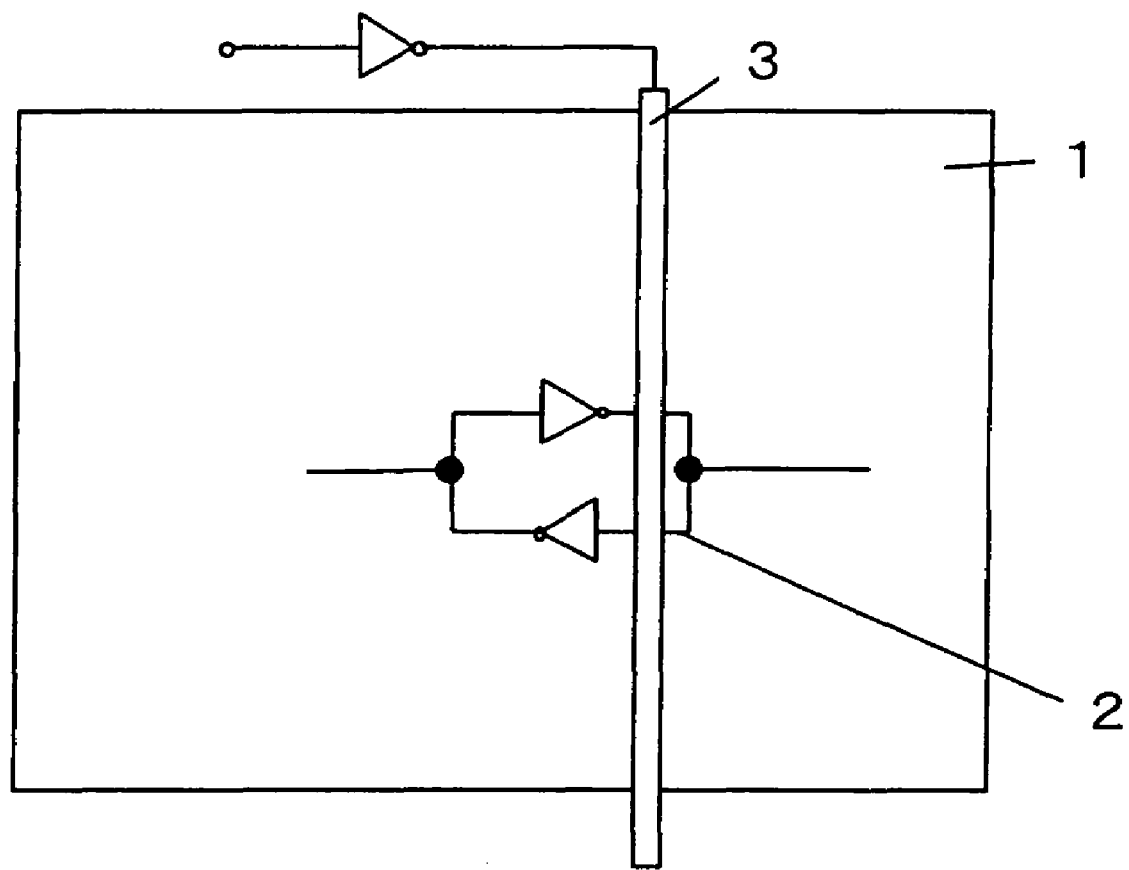
FIG. 12 is a block diagram of a conventional semiconductor device.

Referring to FIG. 11A and FIG. 11B, description will be made of a circuit diagram of a latch circuit (flip-flop) embedded in a semiconductor device in a ninth embodiment according to the present invention, and a plan view indicating an example of an interconnection of the latch circuit, respectively. In FIG. 11A and FIG. 11B, reference numeral 111 represents a signal line which is formed with a (N−1)-th interconnection layer and comprises a latch circuit; reference numeral 112, a signal line formed with an N-th interconnection layer; reference numeral 113, a power supply interconnection which is formed with a (N+1)-th interconnection layer and also serves as a shield interconnection; and reference numeral 114, a power supply line. The power supply interconnection 113 which also serves as the shield interconnection is connected to neither the power supply interconnection nor the ground interconnection in a macro cell, but is provided with a fixed potential (for example VSS) from an external source.

A remarkable discrepancy between this embodiment and the sixth embodiment mentioned above is that only a node which is overlaid (jumper interconnection) by a signal line among the nodes comprising a certain latch circuit is partially shielded as shown in FIG. 11A and FIG. 11B.

According to this configuration, when a signal line from another functional block straddles over a node which comprises the latch circuit to thereby generate a signal change at a voltage higher than a voltage retaining latch data, the problem is to make the retained data being inverted by means of a capacitance coupling effect between interconnections. For this reason, when the capacitance effect between the interconnections is further increased, the power supply interconnection 113 also serving as the shield interconnection is arranged so as to overlap on the signal line 112 (jumper line) for overlaying on the upper interconnection layer among signal lines comprising the latch node, and a signal line from an external source (for example, signal line from another functional block mentioned above) is formed in the (N+2)-th interconnection layer upper than that layer by one. By means of configuring like this, an effect of the noise is effectively reduced, and a decrease in interconnection flexibility due to adding a shield interconnection can be suppressed as much as possible.

Incidentally, although description has been made of the semiconductor device which has been formed on the silicon semiconductor substrate in above each embodiment, the semiconductor device may be formed on a SOI (silicon on insulator) substrate.

What is claimed is:

1. In a semiconductor device wherein a plurality of interconnection layers including a (N−1)-th (N is an integer equal to two or more) interconnection layer, and an N-th interconnection layer are stacked on a substrate from a lower layer to an upper layer in order, and insulating layers are provided between the substrate and the lowest interconnection layer, and between respective interconnection layers, respectively, the semiconductor device, comprising:

at least one functional block of a first type and at least one functional block of a second type, different from said first type, collectively arranged with said (N−1)-th interconnection layer; and a shield layer formed with said N-th interconnection layer and over said at least one functional block of the first type but not said at least one functional block of the second type.

2. A semiconductor device, wherein semiconductor elements are formed on a substrate, the semiconductor device comprising:

at least one functional block including a plurality of logic cells, and a shield layer arranged to cover at least one of the plurality of logic cells but not the other one of the plurality of logic cells.

3. The semiconductor device according to claim 2, wherein said shield layer is also used as a power supply interconnection.

4. The semiconductor device according to claim 3, wherein said power supply interconnection is provided with a fixed voltage.

5. The semiconductor device according to claim 2, wherein said at least one functional block is dynamically controlled.

6. The semiconductor device according to claim 2, wherein a power potential of said functional block is capable of being varied by a level shifter.

7. The semiconductor device according to claim 2, wherein a substrate voltage potential of said functional block is capable of being varied by a level shifter.

8. The semiconductor device according to claim 2, wherein said substrate is a silicon semiconductor substrate or an SOI substrate.

9. The semiconductor device according to claim 2, wherein said at least one functional block is a latch circuit.

* * * * *